United States Patent [19]

Su et al.

[11] Patent Number: 5,093,692
[45] Date of Patent: Mar. 3, 1992

[54] TUNNEL DIODE DETECTOR FOR MICROWAVE FREQUENCY APPLICATIONS

[75] Inventors: Chung-Yi Su, Milpitas; Sanehiko Kakihana, Palo Alto, both of Calif.; Domingo A. Figueredo, Bellingham, Wash.

[73] Assignee: Menlo Industries, Inc., Fremont, Calif.

[21] Appl. No.: 612,152

[22] Filed: Nov. 9, 1990

[51] Int. Cl.$^5$ ............................................. H01L 29/88
[52] U.S. Cl. .................................. 357/12; 357/16; 357/63; 357/56
[58] Field of Search ....................... 357/12, 16, 63, 56

[56] References Cited

U.S. PATENT DOCUMENTS

| | | | |
|---|---|---|---|
| 3,713,909 | 1/1973 | Rosevear et al. | 357/12 |
| 3,746,948 | 7/1973 | Marek | 357/12 |
| 4,371,884 | 2/1983 | Esaki et al. | 357/12 |

FOREIGN PATENT DOCUMENTS

| | | | |
|---|---|---|---|
| 1286645 | 1/1969 | Fed. Rep. of Germany | 357/12 |
| 56-31903 | 7/1981 | Japan | |
| 1-214164 | 8/1989 | Japan | 357/12 |
| 1-227479 | 9/1989 | Japan | 357/12 |

OTHER PUBLICATIONS

Article entitled "Design Principles and Construction of Planar Ge Esaki Diodes", by R. E. Davis and G. Gibbons, *Solid State Electronics*, 1967, vol. 10, pp. 461–472.
Article entitled "Tunnel Diodes by Vapor Growth of Ge on Ge and on GaAs", by J. C. Marinance, *IBM Journal*, Jul. 1960, pp. 280–282.

*Primary Examiner*—William Mintel
*Attorney, Agent, or Firm*—Skjerven, Morrill, MacPherson, Franklin & Friel

[57] ABSTRACT

A tunnel diode is disclosed having a highly P-doped layer of indium gallium arsenide formed on a highly N-doped layer of indium gallium arsenide which is supported on a semi-insulating substrate of indium phosphide. In an alternative embodiment, a tunnel diode is disclosed which has a highly P-doped layer of indium gallium arsenide formed on a highly N-doped layer of indium gallium arsenide which is supported on an N-doped substrate.

26 Claims, 11 Drawing Sheets

TUNNEL DIODE DETECTOR FOR MICROWAVE FREQUENCY APPLICATIONS

BACKGROUND OF THE INVENTION

1. Field of the Invention

This invention relates to tunnel diodes and the manufacture thereof, and more particularly to tunnel diode detectors particularly useful in microwave frequency circuits.

2. Description of the Prior Art

Early tunnel diodes were produced by a planar process in which the junction was created by an alloy process. An article entitled "Design Principles and Construction of Planar Ge Esaki Diodes" by R. E. Davis and G. Gibbons, which appeared in Solid-State Electronics, 1967, volume 10 pages 461–472 describes an alloyed junction tunnel diode and processes utilized to construct such a diode. The authors note that they prefer the alloy process for forming the junction, as contrasted to using diffusion, or high temperature vapor deposition of N+ germanium doped with phosphorus, which is grown on P+ germanium substrates.

An example of a typical process for producing an alloy junction tunnel diode of the type described in the Davis et al. article is illustrated in FIGS. 1a through 1f. Referring to FIG. 1a, the process for producing an alloyed junction tunnel diode begins with providing a germanium substrate 1 which is doped with a P type dopant, such as for example, gallium, to a doping concentration of about $5 \times 10^{19}$ atoms/cm$^3$. A layer of silicon dioxide 2 is formed on surface 3 of substrate 1 by for example, chemical vapor deposition to cover surface 3 to a thickness of approximately 10,000 Å (FIG. 1b). Next, surface 5 of layer 2 is patterned, using conventional photolithography techniques, and opening 4 is etched down to surface 3 using wet or dry etching techniques (FIG. 1c). Opening 4 is used to define the junction between the to be applied alloy and surface 3 of germanium substrate 1. Following the definition of opening 4, a photoresist (not shown) is applied to surfaces 5 and 3 of FIG. 1c and patterned to define the desired configuration of the alloy to be applied. FIG. 1d illustrates the structure which results from the application of alloy 6, which may be for example Sn-As or Sn-Sb, which is typically applied by the process of metal evaporation, followed by the removal of the photoresist. After deposition of alloy 6 the metal alloy is alloyed with the Ge semiconductor at an elevated temperature. Top contact 7 is applied to exposed surface 8 of alloy 6 by a process of for example, gold plating, to a thickness of 3-6 microns (FIG. 1e). To complete the tunnel diode structure, contact to substrate 1 is provided by the application to surface 9 of back contact 10, which may consist of, for example, gold material, which may be applied by the process of evaporation to a thickness of, for example, 3,000 Å.

One of the difficulties in producing desirable tunnel diodes of the type utilizing an alloy junction, as described above, arises because of the nonuniformity of the junction between the doped alloy metal and the oppositely doped semiconductor substrate. To illustrate this nonuniformity problem, FIG. 1g is provided to show a highly enlarged representation of the area in FIG. 1d which is encircled and indicated by reference character g. In FIG. 1g the jagged line separating substrate 1 and alloy 6 illustrates the nonuniform composition of N+/P+ junction which is the result of the alloying and recrystallizing between alloy 6 and substrate 1. This nonuniformity results in the problems of non-uniformity between devices produced by the process, thermal instability, and low power handling capability.

Another prior art technique which has been reported for the production of tunnel diodes involves the utilization of vapor growth of doped germanium on either a P-doped germanium substrate or a P doped gallium arsenide substrate. For example, this type of device is described in an article by J.C. Marinace entitled "Tunnel Diodes by Vapor Growth of Ge on Ge and on GaAs", reported in the IBM Journal, July 1960, pages 280–282.

In the category of devices having the construction of Ge on Ge, the article describes two processes for producing this combination. The first process is described as the "closed-tube process", and the second the "open-tube process". In the closed-tube process, the substrate is comprised of gallium doped germanium onto which a layer of germanium which is phosphorus doped is grown from a monocrystalline germanium source which includes a phosphorus doping. In the open-tube process, the author describes experimental junctions produced on a gallium doped germanium substrate by the vapor deposition from either arsenic- or phosphorus-doped source germanium. Tunnel diodes produced with the germanium or germanium combination described in the article do not lend themselves well to use in microwave frequencies because it is not possible to integrate other components on the germanium substrate since germanium cannot be made semi-insulating.

In the Marinace article the second combination of vapor grown tunnel diodes involves the utilization of a GaAs substrate, which is zinc doped (providing a highly P-doped substrate), onto which P-doped germanium is vapor deposited in the "open-tube" process. Tunnel diodes produced by vapor deposition of Ge on a GaAs substrate are not totally satisfactory because it is difficult to grow an abrupt, degenerately doped P+/N+ junction. Without the desired abrupt junction, the device suffers from the disadvantages of: (i) lower peak to valley current ratios; and (ii) less microwave sensitivity.

Another tunnel diode, or Esaki diode, is described in Japanese Pat. No. SHO 56-31903, by Yoshito Amemiya entitled "An Esaki Diode", issued July 24, 1981 and assigned to Nippon Telegraph and Telephone Corporation. This patent discusses the optimization of doping concentrations in Esaki diodes to maximize the switching speed of the diode. In the description of the invention, the inventor proposes that the preferred composition for the N-type semiconductor region (to achieve fast switching) be $In_xGa_{(1-x)}As$ (provided that $0.1 \leq X \leq 0.6$), $InAs_yP_{(1-y)}$ (provided that $0.1 \leq y \leq 0.6$), or $In_zGa_{(1-z)}Sb$ (provided that $0.1 \leq z \leq 0.95$). The emphasis in the article, as mentioned above, is on maximizing switching speed and this is addressed in terms of selecting dopant concentration ratios for the N-type semiconductor region. No particular attention is directed to the P-type semiconductor region. The article does not mention the implementation of a tunnel diode on a semi-insulating substrate, nor does it address the characteristics desired of a tunnel diode to be used as a microwave detector.

SUMMARY OF THE INVENTION

One of the objects of the present invention is to produce a tunnel diode having performance characteristics similar to that of Ge tunnel diodes, but without any of the disadvantages of alloy junction Ge tunnel diodes.

Another object of the present invention is to produce an improved tunnel diode detector of the non-alloyed junction type particularly suitable for use as a microwave detector.

Another object of the present invention is to produce a non-alloyed junction tunnel diode on a non-conductive (semi-insulating) substrate thereby making it possible to add other components on the substrate, thereby to produce an integrated circuit.

Another object of the present invention is to controllably adjust the video resistance ($R_v$) of the diode to optimize microwave performance.

In accordance with the invention, a ternary system (utilizing InGaAs) is used in the fabrication of tunnel diodes which provide properties similar to Ge tunnel diodes.

In accordance with yet another feature of the invention, a tunnel diode including the first and second above-identified features is produced on a semi-insulating substrate.

In accordance with a further feature of the invention, a ternary system (utilizing InGaAs) is used in the fabrication of tunnel diodes which are formed on a doped substrate.

In accordance with another feature of the present invention, tunnel diodes in accordance with the above features are produced with junctions grown by molecular beam epitaxy.

In accordance with yet another feature of the invention, a process for producing a semiconductor device is provided wherein a layer of highly N-doped InGaAs is epitaxially grown on a semi-insulating substrate and a layer of highly P-doped InGaAs is epitaxially grown on a surface of the highly N-doped InGaAs.

In accordance with a further feature of the invention, a process for producing a semiconductor device is disclosed wherein a layer of highly N-doped InGaAs is epitaxially grown on a highly N-doped InP substrate and a layer of highly P-doped InGaAs is epitaxially grown on a surface of the highly N-doped InGaAs layer. Following establishment of the foregoing structure, electrical contacts are provided, one to the substrate and the other to the highly P-doped layer of InGaAs.

BRIEF DESCRIPTION OF THE DRAWINGS

Other objects and advantages of the invention will become apparent from a study of the specification and drawings in which:

FIGS. 4-16 illustrate the process steps utilized in producing the device illustrated in FIGS. 2 and 3a;

DETAILED DESCRIPTION OF THE PREFERRED EMBODIMENTS

Figure 1A:
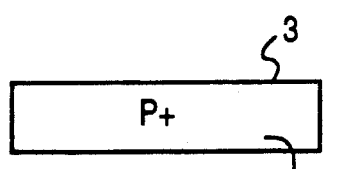
FIGS. 1a-1f illustrate the method for producing an alloy junction tunnel diode in accordance with the prior art.
Figure 1B:
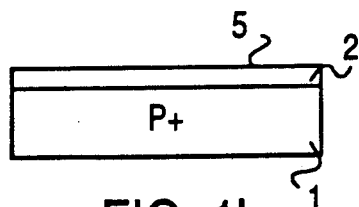
Figure 1C:
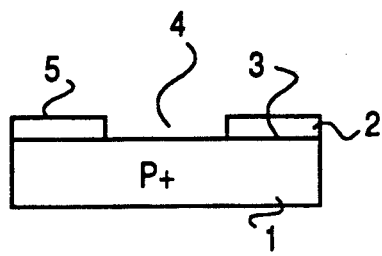
Figure 1D:
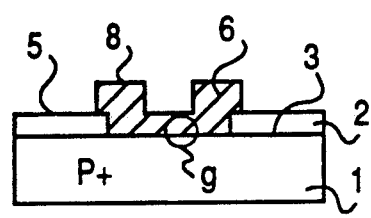
Figure 1E:
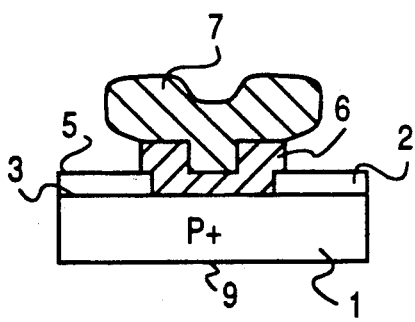
Figure 1F:
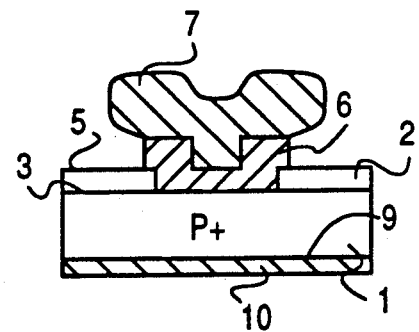
Figure 1G:
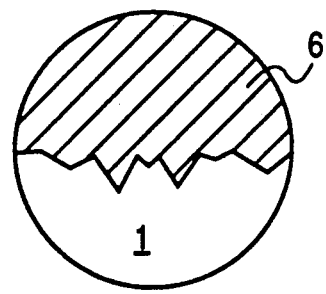
FIG. 1g illustrates a highly magnified cross sectional view of region g in FIG. 1d, showing the non-uniformity of the junction between substrate 1 and alloy 6.
Figure 2:
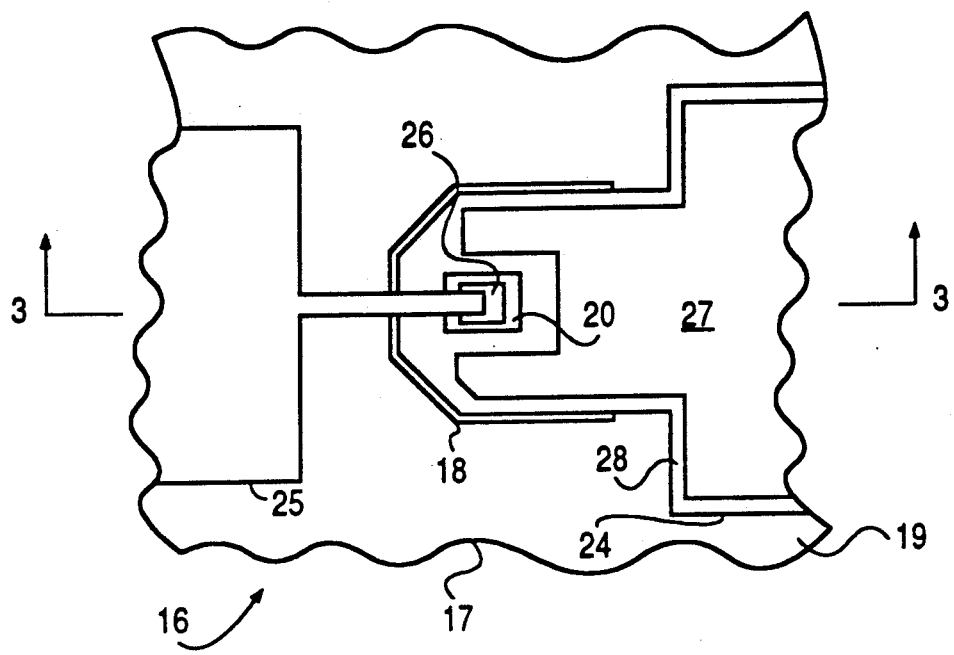
FIG. 2 is a top plan view of a semiconductor device in accordance with a first embodiment of the present invention.
Figure 3A:
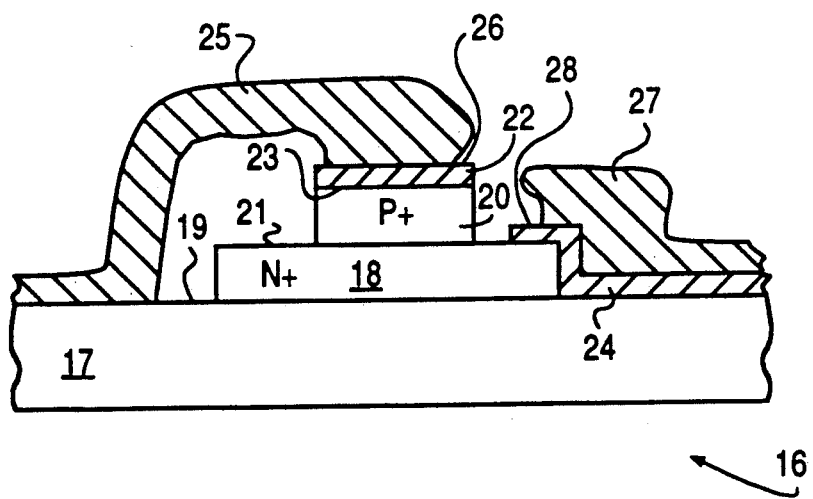
FIG. 3a is a cross-sectional view taken along lines 3—3 in FIG. 2.

FIG. 2 is a top plan view of tunnel diode 16 in accordance with a first embodiment of the present invention. FIG. 3a, which will be described in detail hereinafter, is a cross-sectional view taken along lines 3—3 in FIG. 2. Tunnel diode 16 includes semi-insulating substrate 17 on which highly N-doped layer 18 has been formed, having the geometrical configuration illustrated in FIG. 2. Highly P-doped layer 20 is positioned on surface 21 of highly N-doped layer 18, with the junction between highly N-doped layer 18 and highly P-doped layer 20 defining the tunnel diode. Metallic material 22, comprised of platinum, provides electrical contact to highly P-doped layer 20. Metallic material 24 is deposited on surface 19 of semi-insulating substrate 17 as well as onto a portion of highly N-doped layer 18. Metallic material 24 is composed of an alloy Which will be specifically identified and described in detail hereinafter. Metallic layer 27, which is formed on the surface 28 of metallic material 24, serves to connect highly N-doped layer 18 to other circuit elements as required. Similarly, metallic layer 25, which contacts upper surface 26 of metallic material 22, serves to connect the highly P-doped layer 20 to circuit elements as required.

FIG. 3a is a highly enlarged, cross-sectional view taken along the lines 3—3 of FIG. 2. In addition to being highly enlarged, the structures illustrated in the drawings are also not necessarily to scale. Some structures are featured larger than scale for illustrative purposes. Tunnel diode 16 is comprised of a semi-insulating substrate 17, which may be composed of a suitable semi-insulating material, such as, for example, indium phosphide (InP). Another satisfactory semi-insulating material is gallium arsenide (GaAs). As used herein, the term "semi-insulating" means a material with a resistivity larger than $10^6$ ohm-cm. It is preferable to use a semi-insulating substrate when practicing the present invention in those situations where it is desired to utilize other semiconductor devices or components on the same substrate, for example in making a integrated circuit devices which includes, in addition to the tunnel diode, other circuitry. A typical example of such an integrated circuit device is an electrical detection circuit utilized in the microwave frequency signal range, in which the tunnel diode in accordance with the present invention, is utilized in the detection circuitry. In practicing the present invention it is not necessary to utilize a semi-insulating substrate, however if the invention is to be employed as part of an integrated circuit device, then it is desirable to produce the tunnel diode on a semi-insulating substrate. The present invention may be practiced by forming a tunnel diode having highly N-doped layer 18 formed on a substrate of indium phosphide (InP), and highly P-doped layer 20 formed on highly N-doped layer 18.

Figure 3B:
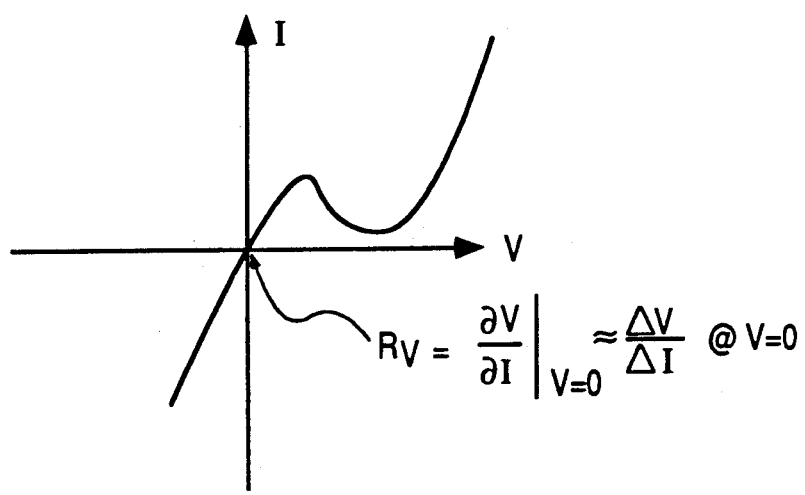
FIG. 3b illustrates a typical conduction curve for a tunnel diode.

When utilizing the present invention in a microwave frequency electrical circuit for signal detection, it is desirable to construct tunnel diode 16, and tunnel diode 50 which is subsequently described, with a video resistance ($R_v$) in the range of from 50 ohms to two thousand ohms or greater. For tunnel diode 16 this is achieved by selecting appropriate doping ratios between highly N-doped layer 18 and highly P-doped layer 20. Similarly, the video resistance ($R_v$) of tunnel diode 50 is established by providing appropriate doping ratios between highly N-doped layer 53 and highly P-doped layer 54. FIG. 3b illustrates the conduction curve for a typical tunnel diode. The video resistance ($R_v$) is determined by the slope of the conduction curve at the point indicated by the arrow in FIG. 3b. The formula for video resistance ($R_v$) is indicated in FIG. 3b and may be represented as at $$\frac{\partial V}{\partial I}$$

at V=0, which is approximately equal to $$\frac{\Delta V}{\Delta I}$$

at V=0. Theoretically, video resistance ($R_v$) can be expressed by the formula:

$$R_v = \beta \, \text{EXP} \left( \frac{\pi E_g}{2 \hbar q} \sqrt{\frac{\epsilon m^*}{N_{\text{eff}}}} \right)$$

where:
$\beta$ = constant that can be determined experimentally
$\pi$ = constant = 3.1415912
$E_g$ = bandgap of semiconductor
$\hbar$ = reduced Planck's constant
$q$ = electron charge
$\epsilon$ = dielectric constant of InGaAs
$m^*$ = electron and hole effective mass $$N_{\text{eff}} = \frac{N_D N_A}{N_A + N_D}$$

where:
$N_D$ = donor doping level
$N_A$ = acceptor doping level

As indicated in the above formula, $\beta$ is equal to a constant that can be determined experimentally, which may be achieved using well known procedures. One procedure for determining $\beta$ is to produce a device, measure the video resistance ($R_v$) and then solve the equation for $\beta$. This is possible since once $R_v$ is determined by measuring the video resistance of the device, $\beta$ is thereby unknown in the formula. As will be appreciated by reference to the above formula, the effective doping, $N_{\text{eff}}$ is equal to the product of the donor doping level and the acceptor doping level divided by the sum of the donor doping level and the acceptor doping level. It will of course be appreciated that by adjusting the donor and acceptor doping levels, the video resistance of the tunnel diode may be tailored to meet the user's requirements.

The video resistance for indium gallium arsenide may be derived from the following formula:

$$R_v = \beta \, \text{EXP} \left( \frac{1.69 \times 10^{10}}{\sqrt{N_{\text{eff}}}} \right)$$

Again, $\beta$ is experimentally determined by the manner set forth above.

The three examples set forth below illustrate how video resistance of approximately 1,500 ohms, 50 ohms and 150 ohms may be achieved when tunnel diode 16 is produced utilizing highly N-doped layer 18, of indium gallium arsenide, doped at the donor doping level ($N_D$) indicated in conjunction with highly P-doped layer 20, also of indium gallium arsenide, doped at the acceptor doping level ($N_A$) indicated. The computation of the effective doping level ($N_{\text{eff}}$) is as indicated.

|  | $N_D$ | $N_A$ | $N_{EFF}$ | $R_V$ | Comment |
| --- | --- | --- | --- | --- | --- |
| Example I | $5 \times 10^{18}$ | $4 \times 10^{19}$ | $4.44 \times 10^{18}$ | ~1,500 Ω | "Low" doping |
| Example II | $8 \times 10^{18}$ | $9.6 \times 10^{19}$ | $7.38 \times 10^{18}$ | ~50 Ω | High doping |
| Example III | $6.6 \times 10^{18}$ | $8 \times 10^{19}$ | $6.10 \times 10^{18}$ | ~150 Ω | Mid-Range |

When tunnel diode 16 is utilized in an electric detection circuit for microwave frequency signals, it has been found that diodes made according to each of the above examples performed well. A tunnel diode made in accordance with Example III is preferred because it represents the optimum compromise between video resistance and sensitivity. Quite satisfactory tunnel diodes may be constructed with a video resistance in a range of from about 50 ohms to about 1,500 ohms. It will of course be appreciated that a virtual infinite number of combinations of donor doping levels and acceptor doping levels (also sometimes hereinafter referred to as the donor and acceptor doping concentrations or merely doping concentration) may be utilized to arrive at video resistance within the desired range.

Figure 4:
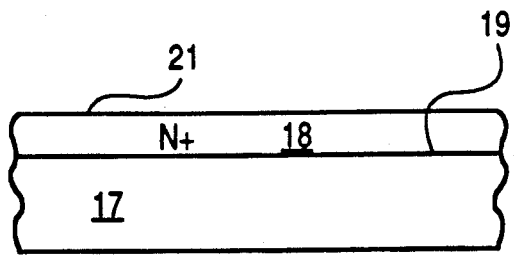
Figure 5:
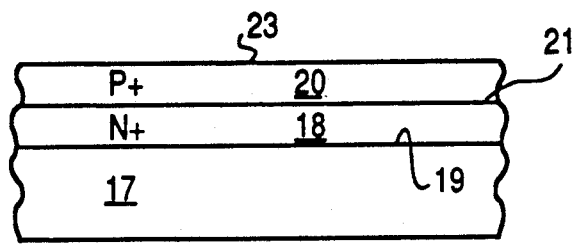
Figure 6:
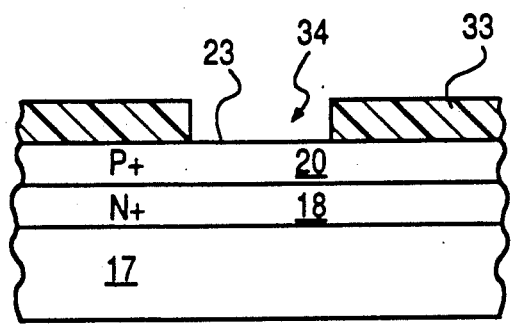
Figure 7:
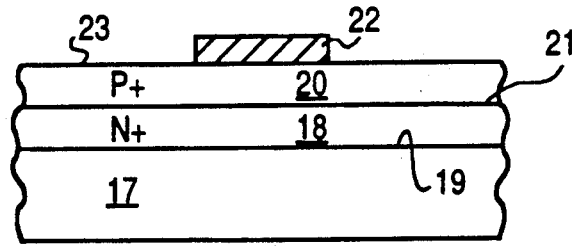
Figure 11:
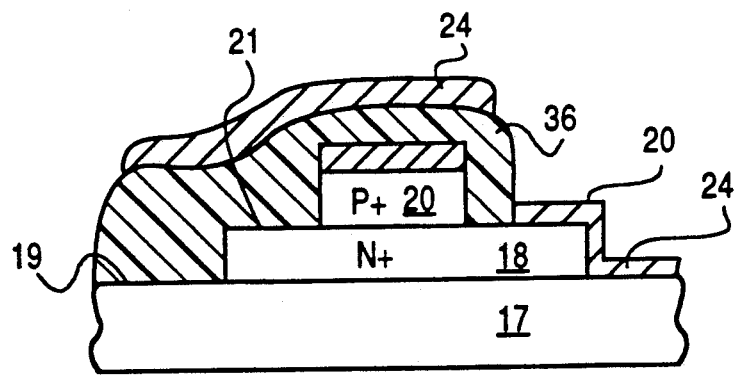
Figure 12:
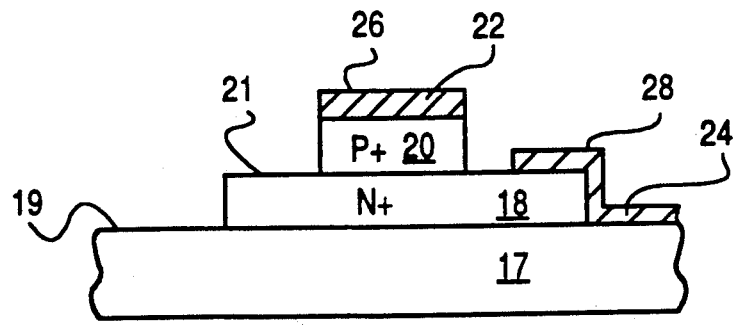

Referring to FIG. 4, highly N-doped layer 18 of indium gallium arsenide (InGaAs) is grown on surface 19 by epitaxial techniques, such as, for example, molecular beam epitaxy or metal-organic molecular beam epitaxy (MOMBE) or metal organic chemical vapor deposition (MOCVD). Details of the preferred process for producing tunnel diode 16 will be described later in the specification. It is preferable that surface 19 of substrate 17 be oriented in the <100> crystal orientation plane. Referring to FIG. 5, highly P-doped layer 20 is epitaxially grown on surface 21 of highly N-doped layer 18. Epitaxial growth of layer 20 may be accomplished utilizing the same techniques as those used in growing highly N-doped layer 18. Referring to FIGS. 5-7, electrical contact to highly P-doped layer 20 is achieved by applying metallic material 22, which may be for example platinum, which is applied to surface 23 of highly P-doped layer 20. Metallic material 22 may be, for example, deposited by evaporation to a thickness of about 1,000 Å. Referring to FIGS. 11-12, electrical contact to highly N-doped layer 18 is accomplished by metallic material 24, which may be, for example, an alloy of Au, Ge and Ni; or an alloy of NiCr, Au, and Ge. Metallic material 24 contacts surface 21 of highly N-doped layer 18, the edge of highly N-doped layer 18 (unnumbered) and portions of surface 19 of semi-insulating substrate 17. Electrical connection between other circuitry and tunnel diode 16 is achieved by metallic layer 25, which may be for example gold, which is in contact with surface 26 of metallic material 22 on highly P-doped layer 23 and by metallic layer 27, which is preferably gold, which is applied to surface 28 of metallic material 24. As will be appreciated by reference to FIG. 3, an airbridge is utilized in conjunction with metallic layer 25 so that metallic layer 25 contacts only metallic material 2 and does not make electrical contact with highly N-doped layer 18. As mentioned above, the details of producing a structure illustrated in FIGS. 2 and 3a will be described subsequently.

The process for manufacturing tunnel diode 16 begins with the selection of a suitable substrate. In the first embodiment, a semi-insulating substrate is utilized and as pointed out above, examples of suitable semi-insulating materials include InP and GaAs. In the preferred embodiment the substrate is comprised of semi-insulating indium phosphide (InP). In the example described beginning with FIG. 4, semi-insulating substrate 17 has been selected to be InP which is doped with iron to make it neutral. As used herein, the term iron means metallic iron (Fe). In producing the tunnel diode device illustrated herein, it is preferable that surface 19 of semi-insulated substrate 17 be in the $<100>$ crystal orientation plane. Highly N-doped layer 18 is epitaxially grown on surface 19 through the use of commercially available equipment and processes. The preferred process is molecular beam epitaxy, however other epitaxial techniques such as metal-organic molecular beam epitaxy (MOMBE) or metal organic chemical vapor deposition (MOCVD) may also be used. It is preferable that highly N-doped layer 18 be doped as it is grown. The preferred dopant is silicon, and the doping is performed to provide a doping concentration in the preferred range of from $4 \times 10^{18}$ to $8 \times 10^{18}$ atoms/cm$^3$. Alternately, a lower doping level may be used, down to about $1 \times 10^{18}$ atom/cm$^3$. Alternative dopants for layer 18 include selenium, germanium and tin. Layer 18 is grown to a thickness of approximately 8,000 Å. The next step, illustrated in FIG. 5, comprises growing highly P-doped layer 20, which is also composed of InGaAs, using one of the generally available epitaxial growth techniques of the type indicated above. It has been found that the preferable technique for growing both layers 18 and 20 is molecular beam epitaxy. In similar fashion to that mentioned above, layer 20 is doped during growth. The preferred dopant is beryllium and the preferred concentration is in the range of from $4 \times 10^{19}$ to $10 \times 10^{19}$ atoms/cm$^3$. Alternately, the doping may be in the range of $1 \times 10^{19}$ to $10 \times 10^{19}$ atoms/cm$^3$. Other suitable dopants to provide the highly P-doped characteristic of layer 20 include magnesium, manganese, zinc, lithium and cadmium. Following the establishment of the highly P-doped and highly N-doped regions on substrate 17, the electrical contact for highly P-doped layer 20 is defined, this process being illustrated in FIGS. 6 and 7. As illustrated in FIG. 6, a photoresist layer 33 is applied to surface 23 of highly P-doped layer 20 and patterned to provide an opening 34 down to surface 23 at the location where the electrical contact to highly P-doped layer 20 is to be formed. The characteristics of photoresist 33 are dependent upon the processes involved in providing metallic material 22 (which functions as the electrical contact to highly P-doped layer 20). In the preferred embodiment, photoresist 33 would be for example AZ5210E from Hoechst Celanese Company. Metallic material 22 is formed by depositing platinum by an evaporative process to the structure illustrated in FIG. 6. Following this deposition, which is performed until the L metallic material is approximately 1,000 Å thick, the unwanted portion of the metallic material is removed by the lift-off process well known to those skilled in the art. Following the lift-off, the structure remaining is illustrated in FIG. 7 where metallic material 22 is positioned on surface 23 of highly P-doped layer 20. The size and configuration of metallic material 22 is selected to define the configuration of highly P-doped layer 20 which is desired in the completed product since, as will be described below, metallic material 22 also serves as an etch mask.

Figure 8:
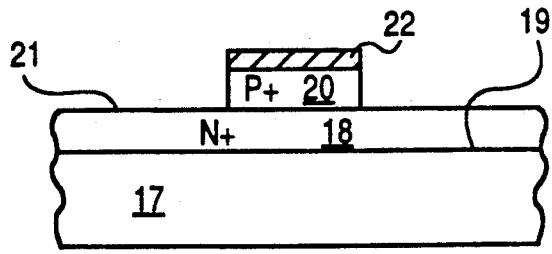
Figure 9:
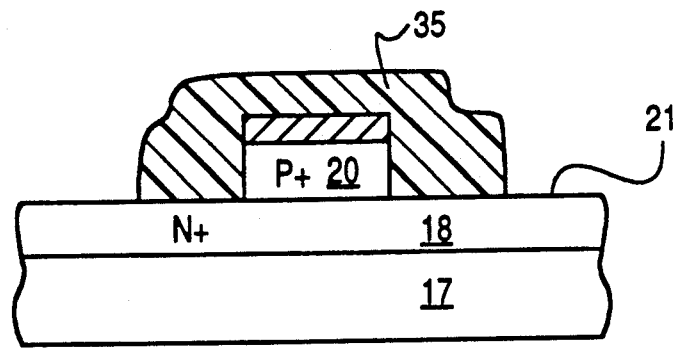

Thus size and configuration of highly P-doped layer 20 is defined by wet etching with a combination of phosphoric acid, hydrogen peroxide and water in ratio, respectively, of 1:1:38 by volume at 25° C. The structure illustrated in FIG. 7 is etched until the unprotected portions of highly P-doped layer 20 are removed down to surface 21 of highly N-doped layer 18. The structure resulting after completion of the etch as illustrated in FIG. 8.

Figure 10:
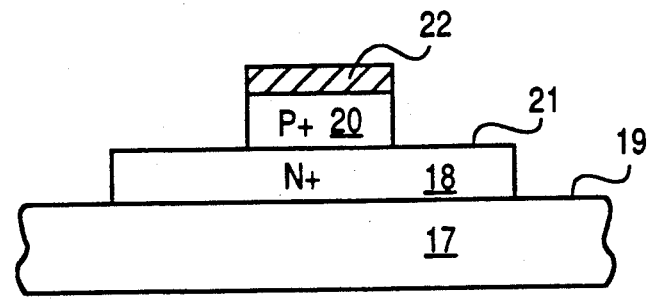

Next, the geometric configuration and area of highly N-doped layer 18 is defined by applying photoresist 35 to the surface 21 of highly N-doped layer 18 as well as also covering metallic material 22 and highly P-doped layer 20. Photoresist 35 is then patterned to define the ultimately desired geometric configuration for highly N-doped layer 18. Following the patterning, a wet etch using $H_3PO_4:H_2O_2:H_2O$, (at a ratio by volume of 3:1:20, respectively) at a temperature of approximately 25° C., for suitable time to remove the unwanted portions of highly N-doped layer 18 is then performed. When using the foregoing etching composition, a suitable photoresist 35 for this process would be, for example, AZ1529 (Hoechst Celanese). After the wet etch is concluded the structure remaining, after removing photoresist 35, is illustrated in FIG. 10.

Following the definition of highly N-doped layer 18, metallic material 24 which contacts highly N-doped layer 18 is established. The first step in preparation for deposition of metallic material 24 is the application of photoresist 36 to the upper surface of the device being Photoresist 36 is then patterned to leave unprotected those areas of the surfaces where metallic layer 24 is desired to be deposited. After patterning photoresist 36, metallic material 24 is applied by an evaporative process. A suitable material for photoresist 36 would be, for example, AZ5214E available from Hoechst Celanese Company. It is preferred that metallic material 24 be composed of a combination of Ni, Au, Ge, Au, however other materials, such as a combination of NiCr, Au, Ge, Au, may be used. For either combination, the preferred, final thickness of metallic material 24 is approximately 1,000 Å. When using the former combination of materials, the sequence which is followed is: Ni is deposited to a thickness of approximately 120 Å; Au is deposited to a thickness of approximately 490 Å; Ge is deposited to a thickness of approximately 250 Å; and Au is deposited to a thickness of approximately 160 Å. For the latter combination, NiCr is deposited to a thickness of about 120 Å and the other three metals are deposited to the same thickness as indicated in the former example. After deposition of metallic material 24, photoresist 36 is removed and the resulting structure is illustrated in FIG. 12. The structure as illustrated in FIG. 12 is placed in an oven and brought to a temperature of approximately 430° C. for about 30 seconds to alloy metallic material 24.

Figure 13:
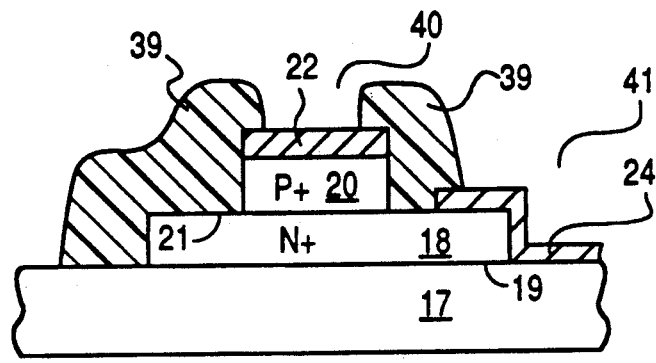

After completion to the extent illustrated in FIG. 12, to provide connection of the tunnel diode 16 to other circuit components of, for example, a microwave detector circuit, a process is required to create metallic layer 27 and metallic layer 25 (illustrated in FIGS. 2 and 3a) for coupling, respectively, highly N-doped layer 18 and highly P-doped layer 20 to other circuit elements within the microwave detection circuit. Although various processes may be used, the preferred process for producing metallic layer 25 and metallic layer 27 is illustrated beginning with FIG. 13 and continuing through FIG. 16. Turning to FIG. 13, photoresist 39 is applied to the upper surfaces of tunnel diode 16 and photoresist 39 is thereafter patterned to provide opening 40 which defines the to be formed connection between metallic layer 25 and metallic layer 22, as well as defining surface area 41 above metallic material 24, which establishes the contact area between metallic layer 27 and metallic material 24. The resulting patterned structure is illustrated in FIG. 13.

Figure 14:
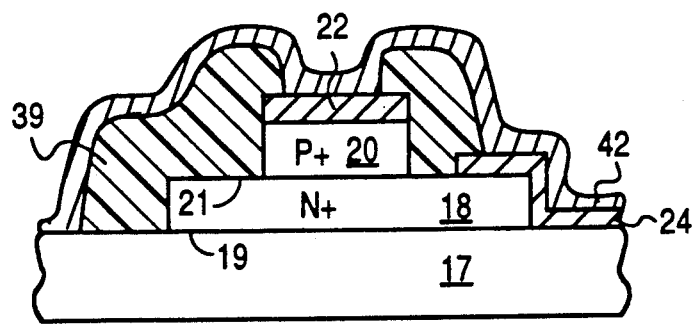

An intermediate metallic layer 42 is deposited over the upper surface of the structure illustrated in FIG. 13, resulting in the configuration and structure shown in FIG. 14. Intermediate metallic layer 42 comprises a first layer of titanium, a second layer of gold and a third layer of titanium deposited in that order. These layers are applied by the process of evaporation. The first titanium layer has a thickness of approximately 500 Å, the gold layer has a thickness of approximately 1,000 Å, and the upper, or top layer as viewed in FIG. 14, which is of titanium, has a thickness of approximately 200 Å.

Figure 15:
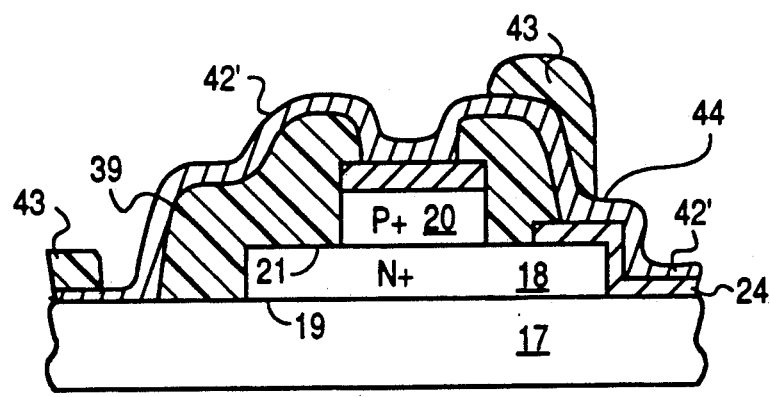
Figure 16:
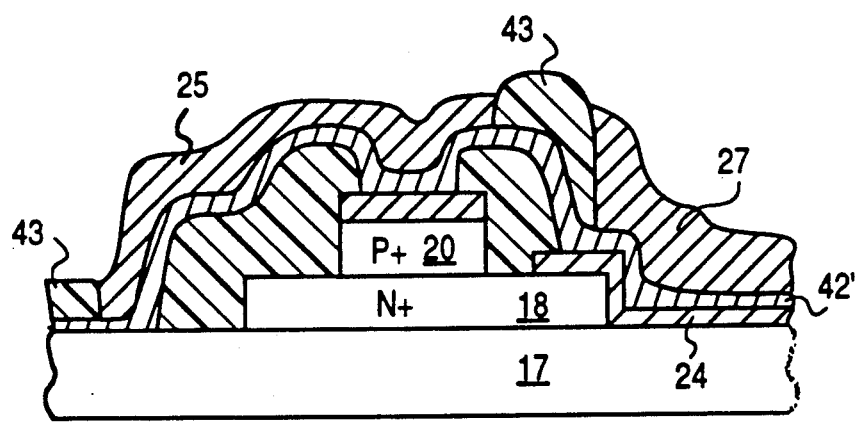

Next, photoresist 43 is applied to the exposed surface of the structure and patterned to retain portions of photoresist 43 as illustrated in FIG. 15. Photoresist 43 may be for example AZ4400 by Hoechst Celanese Company and should be applied to a thickness of approximately 3 microns. Photoresist 43 must be selected to be sufficiently durable to endure a to be performed etch of the upper titanium layer of intermediate metallic layer 42. Following the patterning of photoresist 43, an etch process is performed utilizing H$_2$O:HF solution at ratio, respectively, of 40:1 by volume, at 25° C. for 20 seconds to remove the upper titanium layer of intermediate metallic layer 42 down to the central gold layer in all of those areas which are unprotected by photoresist 43. For clarity, the resulting structure illustrated in FIG. 15 following the etching of the upper titanium layer, the remaining layer is indicated by reference character 42' since that which remains on the surface is the first layer of titanium and gold which is exposed on surface 44. After completion of the device to the degree illustrated in FIG. 15, the structure is then placed in a plating bath of conventional construction and gold is applied to a thickness of approximately 4 microns. The gold adheres to the exposed gold surface 44, resulting in the construction illustrated in FIG. 16. After the gold plating is completed, this defines metal layer 25 and metal layer 27, the contacts to the adjacent electrical circuitry for tunnel diode 16. In FIGS. 14–16 intermediate metallic layer 42 and 42' are shown in highly magnified thickness and are not to scale with respect to the other portions of the device. The thickness of layer 42' (which comprises the lower titanium layer and upper gold layer exposed at surface 44 is approximately 1,500 Å thick.) In contrast, the gold plated metallic layer 25 and 27 is approximately 4 microns (40,000 Å) thick. Therefore it will be appreciated that the intermediate metallic layer 42 and 42' are highly exaggerated in the figures in which they are shown. Further, in view of the relatively small thickness of layer 42' with respect to gold plated metallic layers 25 and 27, intermediate metallic layer 42' is not shown in FIG. 3a.

After completion of the above-described gold plating operation, photoresist 43 is removed and layer 42 (Ti,Au,Ti) is etched away. To remove layer 42, which was previously protected by photoresist 43, the first step involves using a mixture of 40 parts H$_2$O and one part HF by volume at room temperature to etch away the titanium. The gold layer which is now exposed is etched away using Hunt Chemical (semiconductor grade) gold etch. Finally, the remaining titanium layer is removed using the same type of etching process utilized in removing the second titanium layer. Both of the titanium etches are conducted at 25° C. The foregoing etching results in the removal of those portions of layer 42 which are unprotected by the gold, metallic layers 25 and 27. Next, photoresist 39 is removed by using a resist stripper, such as acetone. The completed structure is as illustrated in FIGS. 2 and 3a.

Figure 17:
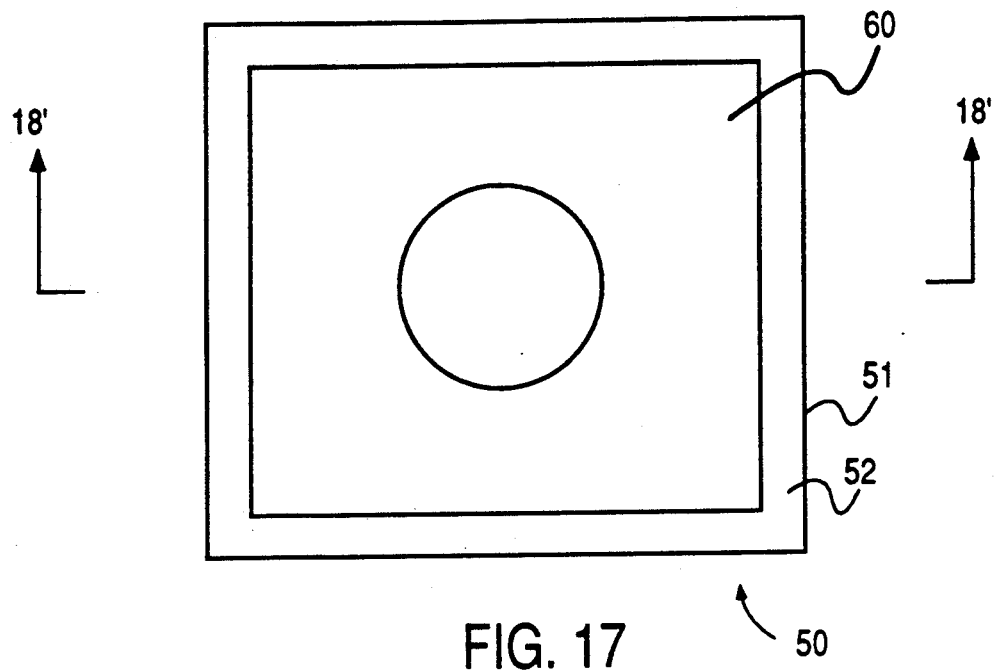
FIG. 17 is a top plan view of a semiconductor device in accordance with a second embodiment of the present invention.
Figure 18:
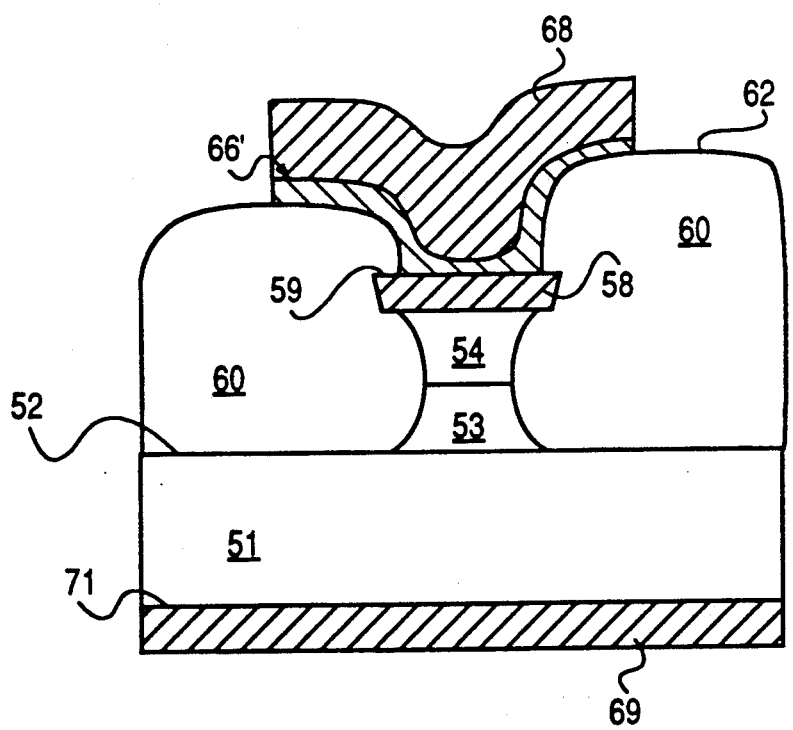
FIG. 18 is a cross-sectional view taken along lines 18—18 of FIG. 17.
Figure 19:
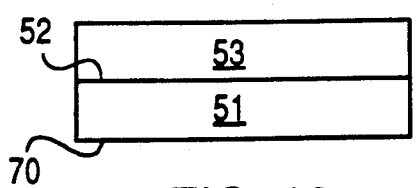
FIGS. 19-27 illustrate the process steps utilized in producing the device illustrated in FIGS. 17 and 18.
Figure 20:
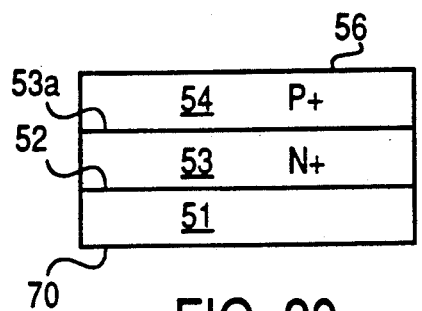

A second embodiment of our invention is illustrated in FIG. 17, which discloses in top plan view tunnel diode 50. A cross sectional view of tunnel diode 50, taken along lines 18'—18', is illustrated in FIG. 18. The preferred process for producing tunnel diode 50 is described below with the aid of FIGS. 19–27. Referring to FIG. 19, the process for producing tunnel diode 50 begins with providing substrate 51, which is preferably comprised of indium phosphide, which is highly doped with tin (Sn) or silicon (Si) to a level of, for example, approximately $10^{19}$ atoms per cubic centimeter. It is preferred that substrate 51 have a conductivity of less than 100 Ω cm, and that substrate 51 have an initial thickness, measured from bottom surface 71 to top surface 52, of approximately 500 Åm. On the top surface 52 of substrate 51 highly N-doped epitaxial layer 53 is grown to thickness of approximately 8,000 Å. Epitaxial layer 53 is preferably grown and doped utilizing the same process described earlier with respect to N-doped layer 18, for example as illustrated beginning in FIG. 4. Epitaxial layer 53 may have a thickness in the range of from 800 Å to 8000 Å. Surface 52 of substrate 51 is preferably in the <100> crystallographic plane of orientation. Following the deposition of epitaxial layer 53, epitaxial layer 54 is grown on surface 53a (FIG. 20) of epitaxial layer 53 utilizing the processes of the same type described previously with respect to P-doped layer 20 as illustrated in FIG. 5, for example.

Figure 21:
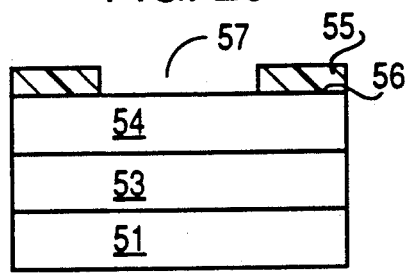
Figure 22:
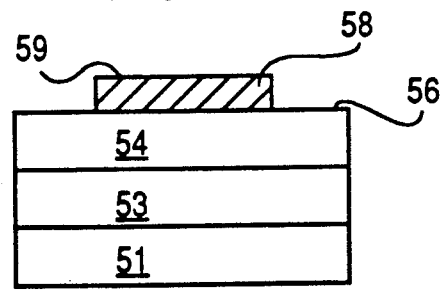

Epitaxial layer 54 is grown to a thickness in the range of from approximately 800 Å to 8,000 Å. N+layer 53 and P+layer 54 are both preferably comprised of indium gallium arsenide. The preferred thickness of layer 53 and layer 54 for tunnel diode 50, when used in the microwave frequency range, is approximately 800 Å for each of the layers. It's preferable to use a thickness at or near the lower end of this range to avoid the undercutting phenomenon, which is described later in connection with the wet etch process illustrated in FIG. 23. Next, photoresist layer 55 is applied to surface 56 of epitaxial layer 54. The preferred photoresist material for photoresist layer 55 is the same as that used for photoresist layer 33 (which was described in connection with the process relating to FIG. 6). Opening 57 is patterned into photoresist layer 55 (FIG. 21). The dimensions of opening 57 may be varied according to the user's specific application. The selection of the size for opening 57 is made based on well-known principles which take into consideration such factors as the frequency range of device and desired current carrying capacity of the device. For devices operating at 20 Ghz, the preferred area for opening 57 is approximately 25 square microns. Following the patterning of opening 57, a platinum layer 58 is deposited using an evaporative deposition process, which may be performed in the manner described previously in connection with the deposition of metallic material illustrated in FIG. 7. After the deposition of conductive layer 58, photoresist 55 is removed, which yields the structure illustrated in FIG. 22. The structure illustrated in FIG. 22 is then subjected to a wet etching process using a combination of phosphoric acid, hydrogen peroxide and water in the ration of, respectively, 1:1:38 by volume. This wet etch is performed preferably at room temperature (which is about 25° C.).

Figure 23:
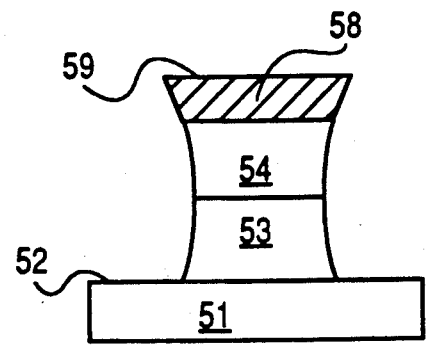
Figure 24:
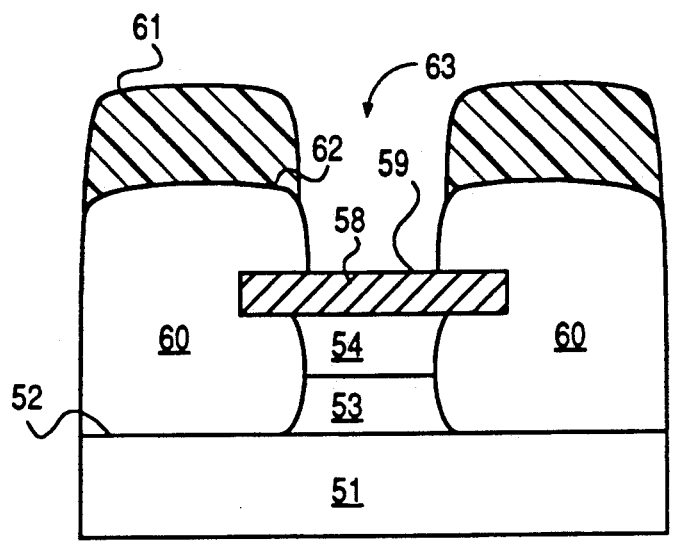
Figure 25:
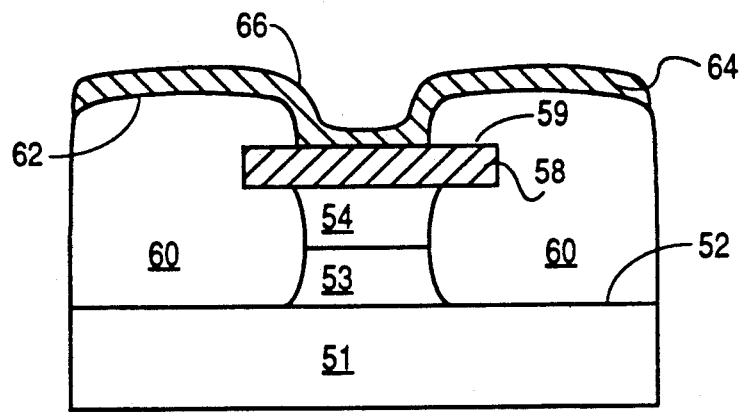
Figure 26:
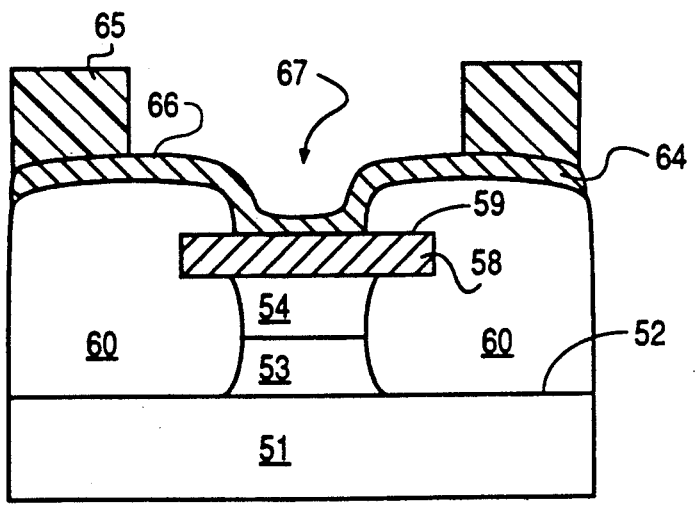
Figure 27:
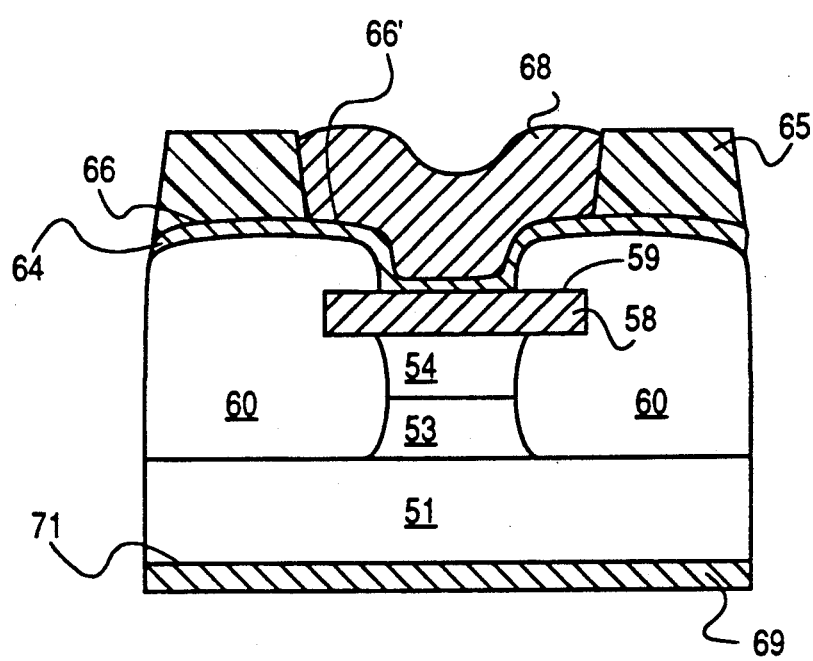

Following the completion of the structure to the extent illustrated in FIG. 23, polyimide layer 60, which is preferably DuPont product number PI-2555, is applied to the upper surface of the structure illustrated in FIG. 23 to a thickness of approximately 3 microns. Next, photoresist layer 61 is applied to upper surface 62 of polyimide layer 60. A suitable material for photoresist layer 61 is product number AZ4400 from Hoechst Celanese Company. Standard light processes for patterning photoresists are then utilized to define the dimensions of opening 63 (FIG. 24). Following the light exposure, a developer of the type recommended by Hoechst Celanese is applied and opening 63 is produced. The developing process is continued until opening 63 is established completely through polyimide layer 60, thereby exposing upper surface 59 of conductive layer 58 (FIG. 24). Following this developing process, photoresist 61 is removed and plating base 64 (FIG. 25) may be produced in the manner identical to that described earlier when layer 42 was deposited on the structure illustrated in FIG. 14. Next photoresist 65 is deposited on upper surface 66 of plating base 64 and patterned as illustrated in FIG. 26 to provide opening 67. A suitable material for photoresist 65 is Hoechst Celanese AZ44000 photoresist (described above). Opening 67 is made of sufficient size to ensure that a good mechanical and electrical contact will be established between the plated gold contact (to be produced in steps which follow) and plating base 64. Following the establishment of opening 67, an etching process of the same type described above with respect to FIG. 15 is performed to remove the upper titanium layer of plating base 64, thus leaving only the gold layer of plating base 64 exposed. This is illustrated in FIG. 27 wherein reference character 66' is used to denote the exposed gold layer which remains after etching the structure illustrated FIG. 26. This etching may be performed in the same manner and with the same etchant described above with respect to FIG. 15. During this etching, it will be appreciated that photoresist layer 65 covers and protects the underlying portion of plating base 64. Following the removal of the upper titanium layer in the area not protected by photoresist 65, gold contact 68 is added. The resulting structure is illustrated in FIG. 27. The gold plating to produce gold layer 68 is performed using the same process as described earlier in the deposition of layer 25 [see FIG. 16 and corresponding text]. The preferred thickness of gold layer 68 is approximately three microns. Next, photoresist layer 65 and plating base 64 are removed utilizing the same process as described above (with respect to FIG. 16) where photoresist 43 and layer 42 (beneath photoresist 43) were removed. Substrate 51 is lapped (using conventional lapping equipment) to a final thickness of approximately 100 microns. Following the lapping process, backside metal 69 (shown in FIGS. 18 and 27), which is comprised of evaporated titanium/gold, is applied to surface 71. The preferred thickness of backside metal 69 is approximately 3,000 Å. The evaporative application of backside metal 69 may be performed by first applying titanium to a thickness of about 600 Å, followed by evaporative application of a thickness of about 3,000 Å.

Those skilled in the art will appreciate that variations may be made to the above described structure and process of producing it without departing from the spirit and scope of the invention. It is of course understood that the invention is not limited by the foregoing explanation and is defined by the following claims.

We claim:

1. In an electrical circuit for use in the microwave frequency range, a tunnel diode comprising:
    a semi-insulating substrate having a surface;
    a first layer of indium gallium arsenide of a first conductivity type on said surface of said substrate, said first layer having an exposed surface;
    a second layer of indium gallium arsenide of a second conductivity type on said exposed surface of said first layer of indium gallium arsenide;
    means for providing electrical contact to said first layer of indium gallium arsenide; and
    means for providing electrical contact to said second layer of indium gallium arsenide.

2. A tunnel diode according to claim 1, wherein said substrate is comprised of indium phosphide.

3. In an electrical circuit for use in a microwave frequency range, a tunnel diode comprising:
    a substrate having a surface;
    a first layer of indium gallium arsenide of a first conductivity type on said surface of said substrate, said first layer having an exposed surface;
    a second layer of indium gallium arsenide of a second conductivity type on said exposed surface of said first layer of indium gallium arsenide;
    means for providing electrical contact to said first layer of indium gallium arsenide; and
    means for providing electrical contact to said second layer of indium gallium arsenide, wherein said first layer of indium gallium arsenide is disposed with silicon to a doping concentration in the range of from $1 \times 10^{18}$ atoms/cm$^3$ to $8 \times 10^{18}$ atoms/cm$^3$ and said second layer of indium gallium arsenide is doped with beryllium to a doping concentration in the range of from $1 \times 10^{19}$ atoms/cm$^3$ to $10 \times 10^{19}$ atoms/cm$^3$.

4. A tunnel diode according to claim 3, wherein said substrate is comprised of semi-insulating indium phosphide.

5. A tunnel diode according to claim 1, wherein said substrate is comprised of a semi-insulating material selected from the group consisting of indium phosphide and gallium arsenide.

6. A semiconductor device comprising:
    a semi-insulating substrate having a surface;

a first layer of indium gallium arsenide of first conductivity type on said surface of said substrate, said first layer having an exposed surface; and a second layer of indium gallium arsenide of second conductivity type on said exposed surface of said first layer of indium gallium arsenide.

7. A semiconductor device according to claim 6, wherein said substrate is comprised of indium phosphide doped with iron to a doping concentration sufficient to make said substrate electrically neutral.

8. A semiconductor according to claim 6, wherein said first layer of indium gallium arsenide is doped with an ion selected from the group consisting of silicon, selenium, tin, and germanium, and said second layer of indium gallium arsenide is doped with an ion selected from the group consisting of beryllium, magnesium, manganese, lithium, zinc, and cadmium.

9. In an electrical circuit for use in the microwave frequency range, a tunnel diode comprising:
  a substrate comprised of indium phosphide of a first conductivity type and having a predetermined conductivity, said substrate having first and second surfaces;
  a first layer of indium gallium arsenide of said first conductivity type on said first surface of said substrate, said first layer having an exposed surface and a conductivity not greater than said predetermined conductivity;
  a second layer of indium gallium arsenide of a second conductivity type on said exposed surface of said second layer of indium gallium arsenide;
  means for providing electrical contact to said second layer of indium gallium arsenide; and
  means for providing electrical contact to said second surface of said substrate.

10. A tunnel diode according to claim 9, wherein said first layer of indium gallium arsenide is doped with silicon to a doping concentration in the range of from $1 \times 10^{18}$ atoms/cm$^3$ to $8 \times 10^{18}$ atoms/cm$^3$ and said second layer of indium gallium arsenide is doped with beryllium to a doping concentration in the range of from $1 \times 10^{19}$ atom/cm$^3$ to $10 \times 10^{19}$ atoms/cm$^3$.

11. A tunnel diode according to any of claims 9-10, wherein the doping concentration in said first layer of indium gallium arsenide and said second layer of indium gallium are provided such that the video resistance ($R_V$) of said diode is in the range of from about fifty ohms to two thousands ohms, where $$R_v = \beta \, \text{EXP}\left(\frac{\pi E_g}{2 \wedge q} \sqrt{\frac{\epsilon \, m^*}{N_{\textit{eff}}}}\right)$$

where:
  $\beta$ = constant that can be determined experimentally
  $\pi$ = constant $\simeq 3.1415912$
  $E_g$ = bandgap of semiconductor
  = reduced Planck's constant
  q = electron charge
  $\epsilon$ = dielectric constant of InGaAs
  m* = electron and hole effective mass $$N_{\textit{eff}} = \frac{N_D N_A}{N_A + N_D}$$

and where:
  $N_D$ = donor doping level
  $N_A$ = acceptor doping level.

12. A tunnel diode according to any of claims 9-10, wherein said first layer of indium gallium arsenide is doped with silicon and said second layer of indium gallium arsenide is doped with beryllium, and further wherein the doping concentration in said first layer of indium gallium arsenide and said second layer of indium gallium arsenide are provided such that the video resistance ($R_V$) of said diode is in the range of from about fifty ohms to two thousand ohms, where $$R_v = \beta \, \text{EXP}\left(\frac{\pi E_g}{2 \wedge q} \sqrt{\frac{\epsilon \, m^*}{N_{\textit{eff}}}}\right)$$

where:
  $\beta$ = constant that can be determined experimentally
  $\pi$ = constant $\sim 3.1415912$
  $E_g$ = bandgap of semiconductor
  = reduced Planck's constant
  q = electron charge
  $\epsilon$ dielectric constant of InGaAs
  m* = electron and hole effective mass $$N_{\textit{eff}} = \frac{N_D N_A}{N_A + N_D}$$

and where:
  $N_D$ = donor doping level
  $N_A$ = acceptor doping level.

13. A tunnel diode according to claim 9, wherein said first layer of indium gallium arsenide is doped with an ion selected from the group consisting of silicon, selenium, tin and germanium, and said second layer of indium gallium arsenide is doped with an ion selected from the group consisting of beryllium, magnesium manganese, lithium, zinc and cadmium.

14. In an electrical circuits for use in the microwave frequency range, a tunnel diode comprising:
  a substrate having a surface;
  a first layer of indium gallium arsenide of a first conductivity type on said surface of said substrate, said first layer having an exposed surface;
  a second layer of indium gallium arsenide of a second conductivity type on said exposed surface of said first layer of indium gallium arsenide;
  means for providing electrical contact to said first layer of indium gallium arsenide; and
  means of providing electrical contact to said second layer of indium gallium arsenide, wherein the doping concentration in said first layer of indium gallium arsenide and said second layer of indium gallium arsenide are provided such that the video resistance ($R_V$) of said diode is in the range of about fifty ohms to two thousands ohms, where $$R_v = \beta \, \text{EXP}\left(\frac{\pi E_g}{2 \wedge q} \sqrt{\frac{\epsilon \, m^*}{N_{\textit{eff}}}}\right)$$

where:
  B = constant that can be determined experimentally
  $\pi$ = constant$\simeq 3.1415912$
  $E_g$ = bandgap of semiconductor
  $\wedge$ = reduced Planck's constant
  q = electron charge
  $\epsilon$ = dielectric constant of InGaAs $m^* =$ electron and hole effective mass $$N_{eff} = \frac{N_D N_A}{N_A + N_D}$$

and where:
  $N_D =$ donor doping level
  $N_A =$ acceptor doping level.

15. In an electrical circuit for use in the microwave frequency range, a tunnel diode comprising:
  a substrate comprised of semi-insulating material, said substrate having a surface;
  a first layer of indium gallium arsenide of a first conductivity type on said surface of said substrate, said first layer having an exposed surface;
  a second layer of indium gallium arsenide of a second conductivity type on said exposed surface of said first layer of indium gallium arsenide;
  means for providing electrical contact to said first layer of indium gallium arsenide; and
  means for providing electrical contact to said second layer of indium gallium arsenide, wherein the doping concentration in said first layer of indium gallium arsenide and said second layer of indium gallium arsenide are provided such that the video resistance ($R_V$) of said diode is in the range of from about fifty ohms to two thousands ohms, where $$R_v = \beta \operatorname{EXP}\left(\frac{\pi E_g}{2 \wedge q} \sqrt{\frac{\epsilon\, m^*}{N_{eff}}}\right)$$

where:
  $\beta =$ constant that can be determined experimentally
  $\pi =$ constant $= 3.1415912$
  $E_g =$ bandgap of semiconductor
  $\wedge =$ reduced Planck's constant
  $q =$ electron charge
  $\epsilon =$ dielectric constant of InGaAs
  $m^* =$ electron and hole effective mass $$N_{eff} = \frac{N_D N_A}{N_A + N_D}$$

and where:
  $N_D =$ donor doping level
  $N_A =$ acceptor doping level.

16. In an electrical circuit for use in the microwave frequency range, a tunnel diode comprising:
  a substrate comprised of indium phosphide, said substrate having a surface;
  a first layer of indium gallium arsenide of a first conductivity type on said surface of said substrate, said first layer having an exposed surface;
  a second layer of indium gallium arsenide of a second conductivity type on said exposed surface of said first layer of indium gallium arsenide;
  means for providing electrical contact to said first layer of indium gallium arsenide; and
  means for providing electrical contact to said second layer of indium gallium arsenide, wherein the doping concentration in said first layer of indium gallium arsenide and said second layer of indium gallium arsenide are provided such that the video resistance ($R_v$) of said diode is in the range of from about fifty ohms to two thousands ohms, where $$R_v = \beta \operatorname{EXP}\left(\frac{\pi E_g}{2 \wedge q} \sqrt{\frac{\epsilon\, m^*}{N_{eff}}}\right)$$

where:
  $\beta =$ constant that can be determined experimentally
  $\pi =$ constant $\sim 3.1415912$
  $E_g =$ bandgap of semiconductor
  $\wedge =$ reduced Planck's constant
  $q =$ electron charge
  $\epsilon =$ dielectric constant of InGaAs
  $m^* =$ electron and hole effective mass $$N_{eff} = \frac{N_D N_A}{N_A + N_D}$$

and where:
  $N_D =$ donor doping level
  $N_A =$ acceptor doping level.

17. In an electrical circuit for use in the microwave frequency range, a tunnel diode comprising:
  a substrate having a surface;
  a first layer of indium gallium arsenide of a first conductivity type on said surface of said substrate, said first layer having an exposed surface;
  a second layer of indium gallium arsenide of a second conductivity type on said exposed surface of said first layer of indium gallium arsenide;
  means for providing electrical contact to said first layer of indium gallium arsenide; and
  means for providing electrical contact to said second layer of indium gallium arsenide, wherein said first layer of indium gallium arsenide is doped with silicon and said second layer of indium gallium arsenide is doped with beryllium, and further wherein the doping concentration in said first layer of indium gallium arsenide are provided such that the video resistance ($R_V$) of said diode is in the range of from about fifty ohms to two thousand ohms, where $$R_v = \beta \operatorname{EXP}\left(\frac{\pi E_g}{2 \wedge q} \sqrt{\frac{\epsilon\, m^*}{N_{eff}}}\right)$$

where:
  $\beta =$ constant that can be determined experimentally
  $\pi =$ constant $\approx 3.1415912$
  $E_g =$ bandgap of semiconductor
  $\wedge =$ reduced Planck's constant
  $q =$ electron charge
  $\epsilon =$ dielectric constant of InGaAs
  $m^* =$ electron and hole effective mass $$N_{eff} = \frac{N_D N_A}{N_A + N_D}$$

and where:
  $N_D =$ donor doping level
  $N_A =$ acceptor doping level.

18. In an electrical circuit for use in the microwave frequency range, a tunnel diode comprising:
  a substrate comprised of semi-insulating material, said substrate having a surface;

a first layer of indium gallium arsenide of a first conductivity type on said surface of said substrate, said first layer having an exposed surface;

a second layer of indium gallium arsenide of a second conductivity type on said exposed surface of said first layer of indium gallium arsenide;

means for providing electrical contact to said first layer of indium gallium arsenide; and means for providing electrical contact to said second layer of indium gallium arsenide, wherein said first layer of indium gallium arsenide is doped with silicon and said second layer of indium gallium arsenide is doped with beryllium, and further wherein the doping concentration in said first layer of indium gallium arsenide and said second layer of indium gallium arsenide are provided such that the video resistance (R$_v$) of said diode is in the range of from about fifty ohms to two thousand ohms, where $$R_v = \beta \, \text{EXP}\left(\frac{\pi E_g}{2 \hbar q} \sqrt{\frac{\epsilon \, m^*}{N_{\text{eff}}}}\right)$$

where:
$\beta$ = constant that can be determined experimentally
$\pi$ = constant ≈ 3.1415912
$E_g$ = bandgap of semiconductor
$\hbar$ = reduced Planck's constant
$q$ = electron charge
$\epsilon$ = dielectric constant of InGaAs
$m^*$ = electron and hole effective mass $$N_{\text{eff}} = \frac{N_D N_A}{N_A + N_D}$$

and where:
$N_D$ = donor doping level
$N_A$ = acceptor doping level.

19. In an electrical circuit for use in the microwave frequency range, a tunnel diode comprising:
a substrate comprised of indium phosphide, said substrate having a surface;
a first layer of indium gallium arsenide of a first conductivity type on said surface of said substrate, said first layer having an exposed surface;
a second layer of indium gallium arsenide of a second conductivity type on said exposed surface of said first layer of indium gallium arsenide;
means for providing electrical contact to said first layer of indium gallium arsenide; and
means for providing electrical contact to said second layer of indium gallium arsenide, wherein said first layer of indium gallium arsenide is doped with silicon and said second layer of indium gallium arsenide is doped with beryllium, and further wherein the doping concentration in said first layer of indium gallium arsenide and said second layer of indium gallium arsenide are provided such that the video resistance (R$_v$) of said diode is in the range of from about fifty ohms to two thousand ohms, where $$R_v = \beta \, \text{EXP}\left(\frac{\pi E_g}{2 \hbar q} \sqrt{\frac{\epsilon \, m^*}{N_{\text{eff}}}}\right)$$

where:
$\beta$ = constant that can be determined experimentally
$\pi$ = constant ≈ 3.1415912
$E_g$ = bandgap of semiconductor
= reduced Planck's constant
$q$ = electron charge
$\epsilon$ = dielectric constant of InGaAs
$m^*$ = electron and hole effective mass $$N_{\text{eff}} = \frac{N_D N_A}{N_A + N_D}$$

and where:
$N_D$ = donor doping level
$N_A$ = acceptor doping level.

20. In an electrical circuit for use in the microwave frequency range, a tunnel diode comprising:
a substrate comprised of indium phosphide, said substrate having a surface;
a first layer of indium gallium arsenide of a first conductivity type on said surface of said substrate, said first layer having an exposed surface;
a second layer of indium gallium arsenide of second conductivity type on said exposed surface of said first layer of indium gallium arsenide;
means for providing electrical contact to said first layer of indium gallium arsenide; and
means for providing electrical contact to said second layer of indium gallium arsenide, wherein said first layer of indium gallium arsenide is doped with an ion selected from the group consisting of silicon, selenium, tin and germanium, and said second layer of indium gallium arsenide is doped with an ion selected from the group consisting of beryllium, magnesium, manganese, lithium, zinc and cadmium.

21. A semiconductor device comprising:
a semi-insulating substrate having a surface;
a first layer of indium gallium arsenide of first conductivity type on said surface of said substrate, said first layer having an exposed surface; and
a second layer of indium gallium arsenide of second conductivity type on said exposed surface of said first layer of indium gallium arsenide, wherein the doping concentration in said first layer of indium gallium arsenide and said second layer of indium gallium arsenide are provided such that the video resistance (R$_v$) of said diode is in the range of from about fifty ohms to two thousands ohms, where $$R_v = \beta \, \text{EXP}\left(\frac{\pi E_g}{2 \hbar q} \sqrt{\frac{\epsilon \, m^*}{N_{\text{eff}}}}\right)$$

where:
$\beta$ = constant that can be determined experimentally
$\pi$ = constant = 3.1415912
$E_g$ = bandgap of semiconductor
$\hbar$ = reduced Planck's constant
$q$ = electron charge
$\epsilon$ = dielectric constant of InGaAs
$m^*$ = electron and hole effective mass $$N_{\text{eff}} = \frac{N_D N_A}{N_A + N_D}$$

and where:

$N_D$ = donor doping level
$N_A$ = acceptor doping level.

22. A semiconductor device comprising:
a semi-insulating substrate comprised of indium phosphide doped with iron to a doping concentration sufficient to make said substrate electrically neutral, said substrate having a surface;
a first layer of indium gallium arsenide of first conductivity type on said surface of said substrate, said first layer having an exposed surface; and
a second layer of indium gallium arsenide of second conductivity type on said exposed surface of said first layer of indium gallium arsenide, wherein the doping concentration in said first layer of indium gallium arsenide and said second layer of indium gallium arsenide are provided such that the video resistance ($R_v$) of said diode is in the range of from about fifty ohms to two thousands ohms, where $$R_v = \beta \, \text{EXP}\left(\frac{\pi E_g}{2 \wedge q} \sqrt{\frac{\epsilon \, m^*}{N_{eff}}}\right)$$

where:
$\beta$ = constant that can be determined experimentally
$\pi$ = constant $\approx$ 3.1415912
$E_g$ = bandgap of semiconductor
$\wedge$ = reduced Planck's constant
$q$ = electron charge
$\epsilon$ = dielectric constant of InGaAs
$m^*$ = electron and hole effective mass $$N_{eff} = \frac{N_D N_A}{N_A + N_D}$$

and where:
$N_D$ = donor doping level
$N_A$ = acceptor doping level.

23. A semiconductor device comprising:
a semi-insulating substrate having a surface;
a first layer of indium gallium arsenide of first conductivity type on said surface of said substrate, said first layer having an exposed surface; and
a second layer of indium gallium arsenide of second conductivity type on said exposed surface of said first layer of indium gallium arsenide, wherein said first layer of indium gallium arsenide is doped with silicon and said second layer of indium gallium arsenide is doped with beryllium, and further wherein the doping concentration in said first layer of indium gallium arsenide and said second layer of indium gallium arsenide are provided such that the video resistance ($R_v$) of said diode is in the range of from about fifty ohms to two thousand ohms, where $$R_v = \beta \, \text{EXP}\left(\frac{\pi E_g}{2 \wedge q} \sqrt{\frac{\epsilon \, m^*}{N_{eff}}}\right)$$

where:
$\beta$ = constant that can be determined experimentally
$\pi$ = constant $\approx$ 31415912
$E_g$ = bandgap of semiconductor
$\wedge$ = reduced Planck's constant
$q$ = electron charge
$\epsilon$ = dielectric constant of InGaAs
$m^*$ = electron and hole effective mass $$N_{eff} = \frac{N_D N_A}{N_A + N_D}$$

and where:
$N_D$ = donor doping level
$N_A$ = acceptor doping level.

24. A semiconductor device comprising
a substrate comprised of indium phosphide doped with iron to a doping concentration sufficient to make said substrate electrically neutral, said substrate having a surface;
a first layer of indium gallium arsenide of first conductivity type on said surface of said substrate, said first layer having an exposed surface; and
a second layer of indium gallium arsenide of second conductivity type on said exposed surface of said first layer of indium gallium arsenide, wherein said first layer of indium gallium arsenide is doped with silicon and said second layer of indium gallium arsenide is doped with beryllium, and further wherein the doping concentration in said first layer of indium gallium arsenide and said second layer of indium gallium arsenide are provided such that the video resistance ($R_v$) of said diode is in the range of from about fifty ohms to two thousand ohms, where $$R_v = \beta \, \text{EXP}\left(\frac{\pi E_g}{2 \wedge q} \sqrt{\frac{\epsilon \, m^*}{N_{eff}}}\right)$$

where:
$\beta$ = constant that can be determined experimentally
$\pi$ = constant $\approx$ 3.1415912
$E_g$ = bandgap of semiconductor
$\wedge$ = reduced Planck's constant
$q$ = electron charge
$\epsilon$ = dielectric constant of InGaAs
$m^*$ = electron and hole effective mass $$N_{eff} = \frac{N_D N_A}{N_A + N_D}$$

and where:
$N_D$ = donor doping level
$N_A$ = acceptor doping level.

25. A semiconductor device comprising:
a semi-insulating substrate having a surface;
a first layer of indium gallium arsenide of first conductivity type on said surface of said substrate, said first layer having an exposed surface; and
a second layer of indium gallium arsenide of second conductivity type on said exposed surface of said first layer of indium gallium arsenide, wherein said dopant for said first layer of indium gallium arsenide comprises silicon and said first layer is doped to a doping concentration in the range of from $1 \times 10^{18}$ atoms/cm$^3$ to $8 \times 10^{18}$ atoms/cm$^3$, and said dopant of said second layer of indium gallium arsenide comprises beryllium and said second layer is doped to a doping concentration in the range of from $1 \times 10^{19}$ atoms/cm$^3$ to $10 \times 10^{19}$ atoms/cm$^3$.

26. A semiconductor device comprising:
a semi-insulating substrate comprised of indium phosphide doped with iron to a doping concentration sufficient to make said substrate electrically neutral, said substrate having a surface;
a first layer of indium gallium arsenide of first conductivity type on said surface of said substrate, said first layer having an exposed surface; and
a second layer of indium gallium arsenide of second conductivity type on said exposed surface of said first layer of indium gallium arsenide, wherein said dopant for said first layer of indium gallium arsenide comprises silicon and said first layer is doped to a doping concentration in the range of from $1 \times 10^{18}$ atoms/cm$^3$ to $8 \times 10^{18}$ atoms/cm$^3$, and said dopant of said second layer of indium gallium arsenide comprises beryllium and said second layer is doped to a doping concentration in the range of from $1 \times 10^{19}$ atoms/cm$^3$ to $10 \times 10^{19}$ atoms/cm$^3$.

* * * * *